United States Patent [19]

Chung et al.

[11] Patent Number: 5,751,653
[45] Date of Patent: May 12, 1998

[54] DRAM WITH REDUCED LEAKAGE CURRENT

[75] Inventors: In Sool Chung; Jae Jin Lee, both of Ichon, Rep. of Korea

[73] Assignee: Hyundai Electronics Industries Co., Ltd., Kyoungki-do, Rep. of Korea

[21] Appl. No.: 867,455

[22] Filed: Jun. 2, 1997

[30] Foreign Application Priority Data

Jun. 29, 1996 [KR] Rep. of Korea ............... 96-25742

[51] Int. Cl.$^6$ .................................................. G11C 13/00
[52] U.S. Cl. ...................... 365/230.06; 365/222; 365/226
[58] Field of Search ........................... 365/230.06, 222, 365/226, 229, 189.09

[56] References Cited

U.S. PATENT DOCUMENTS 5,297,098  3/1994  Nakatani ........................... 365/222
5,590,082  12/1996  Abe ................................... 365/222

Primary Examiner—A. Zarabian
Attorney, Agent, or Firm—Gary M. Nath; Nath & Associates

[57] ABSTRACT

A DRAM with reduced leakage current includes at least two line driving means for transmitting high potential to a line selected by an address signal externally input; a main power line for transmitting a power source voltage externally supplied; secondary power lines for transmitting the power source voltage to the respective line driving means; switching means respectively connected between the main power line and secondary power lines; block selection means for outputting a signal where two block selection addresses are logically combined, to each of the line driving means, in order to select and operate one of the line driving means; and switching control means for outputting a signal which controls each of the switching means through the logical combination of the output signal of the block selection means and a refresh operation mode signal.

7 Claims, 3 Drawing Sheets

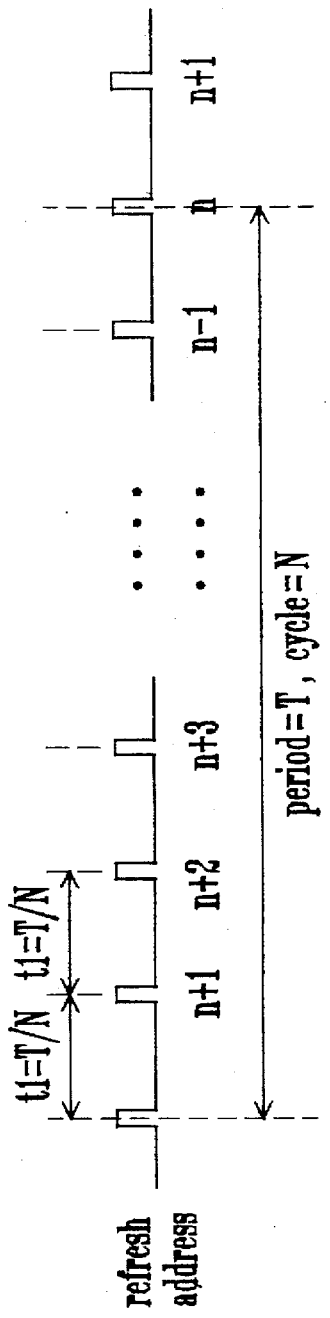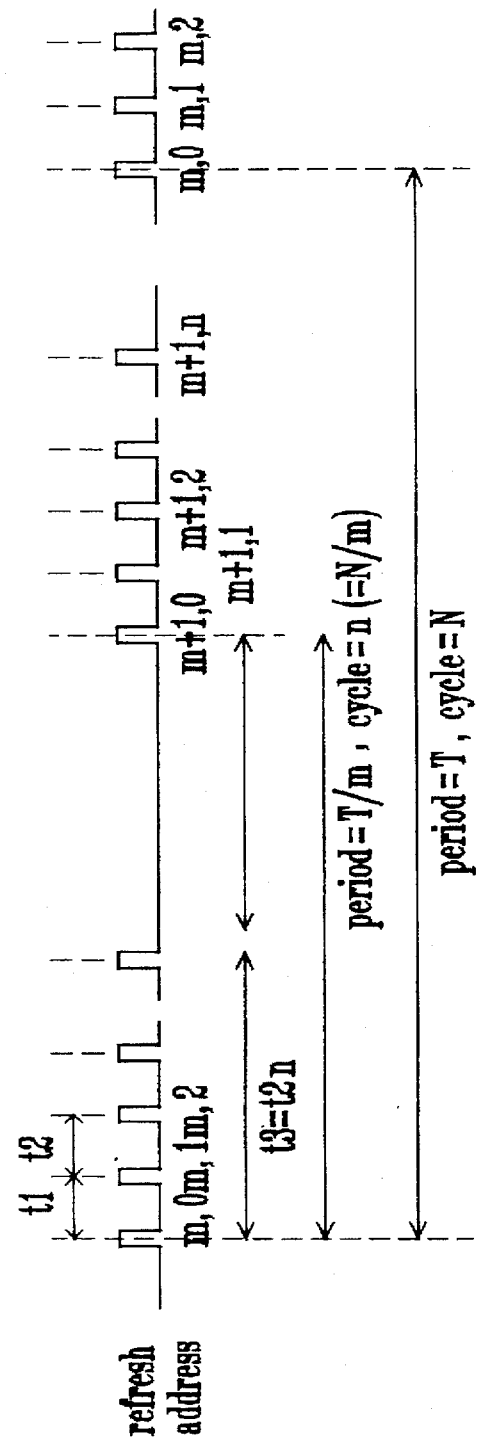

DRAM WITH REDUCED LEAKAGE CURRENT

BACKGROUND OF THE INVENTION

1. Field of the Invention

The present invention relates to a dynamic random access memory (DRAM) device and, more particularly, to a DRAM with reduced leakage current consumed during the waiting operation.

2. Discussion of Related Art

Generally speaking, since a DRAM, a semiconductor memory device, forms a cell with one capacitor and one transistor, the charges stored in the cell are discharged to the cell plate to destroy the cell data, when the chip is neglected in waiting mode where data read/write operation is not performed, for over a predetermined period. For the preservation of DRAM cell's data, it is restored for every predetermined time through refresh operation. This refresh takes a lot of power. In order to reduce the power consumed, self refresh has been increasingly applied to the DRAM chip, which sequentially refreshes the chip's cells, using the chip's built-in counter, when tens of µs pass in the usual CBR mode.

FIG. 1 is a timing diagram of the DRAM's self refresh operation according to the prior art, showing a refresh signal generated internally from the counter. This refresh signal is made in a time interval corresponding to a value in which the refresh operation period is divided by the number of cycles. If the refresh period is T, and N cycles are required for refreshing the entire chip, self refresh is performed in such a manner that refresh signals are made regularly in the period of T/N and address signals are generated respectively for those signals.

For instance, given that the refresh period is 128 msec and the refresh cycle is 8k, a signal of 16µsec (128m divided by 8k) is periodically generated for sequential refresh.

During the waiting mode after the respective refresh operations, the device goes into the waiting mode, and accordingly the transistor devices forming the internal circuits are turned off. In this situation, the transistor consumes leakage current which flows in its OFF state, according to the transistor characteristics. This process is explained with the circuit diagram of FIG. 2.

Referring to FIG. 2, a DRAM includes a block selection circuit portion 11 for outputting a signal which selects a memory cell array block by the logical combination of block selection addresses add1 and add2, and a wordline driving circuit portion 12 for driving a wordline selected by the logical combination of block selection signal a2 and the self refresh operation signal S1.

If block selection addresses add1 and add2 are both HIGH, block selection signal a2 becomes HIGH so as to drive the wordline selected by wordline driving circuit portion 12. Here, it is assumed that refresh operation signal S1 is enabled HIGH. If block selection addresses add1 and add2 are LOW, block selection signal a2 is turned LOW so that the wordline driving circuit portion 12 is disabled and thus the wordline is not driven.

For the conventional DRAM having such a configuration, even in the waiting mode where block selection signal a2 becomes LOW to disable the wordline, the leakage current is undesirably caused from wordline driving circuit portion 12. That is, when block selection signal a3 is HIGH in the inverter of 12b block of wordline driving circuit portion 12, the leakage current generated below threshold potential Vt runs toward output port a4 although PMOS transistor MP6 is turned OFF. This kind of leakage current increases as the threshold potential becomes lower according to the miniaturization of device. With the devices' higher integration, as the number of transistors forming a single chip increases, the leakage current becomes larger.

SUMMARY OF THE INVENTION

Accordingly, the present invention is directed to a DRAM with reduced leakage current that substantially obviates one or more of the problems due to the limitations and disadvantages of the related art.

An object of the present invention is to provide a DRAM in which the leakage current is reduced by applying power only to a wordline driving circuit where refresh is performed, and applying no power to the rest wordline driving circuits where the refresh is not carried out.

Another object of the present invention is to provide a DRAM with reduced leakage current by controlling switching devices according to operation status, with the power line divided into the main and secondary power lines.

Additional features and advantages of the invention will be set forth in the description which follows, and in part will be apparent from the description, or may be learned by practice of the invention. The objectives and other advantages of the invention will be realized and attained by the structure indicated in the written description and claims hereof as well as the appended drawings.

To achieve these and other advantages and in accordance with the purpose of the present invention, as embodied and broadly described, there is provided a DRAM comprising: at least two line driving means for transmitting a high potential to a line selected by an address signal externally input; a main power line for transmitting a power source voltage externally supplied; secondary power lines for transmitting the power source voltage to the respective line driving means; switching means respective connected between the main power line and secondary power lines; block selection means for outputting a signal where two block selection addresses are logically combined, to each of the line driving means, in order to select and operate one of the line driving means; and switching control means for outputting a signal which controls each of the switching means through the logical combination of the output signal of the block selection means and a refresh operation mode signal.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide further understanding of the invention and are incorporated in and constitute a part of this specification, illustrate embodiments of the invention and together with the description serve to explain the principles of the invention.

In the drawings:

FIG. 1 is a timing diagram of the self refresh of a conventional DRAM;

FIG. 3 is a timing diagram of the self refresh of the present invention;

DETAILED DESCRIPTION OF PREFERRED EMBODIMENT

Reference will now be made in detail to the preferred embodiments of the present invention, examples of which are illustrated in the accompanying drawings.

Figure 2:
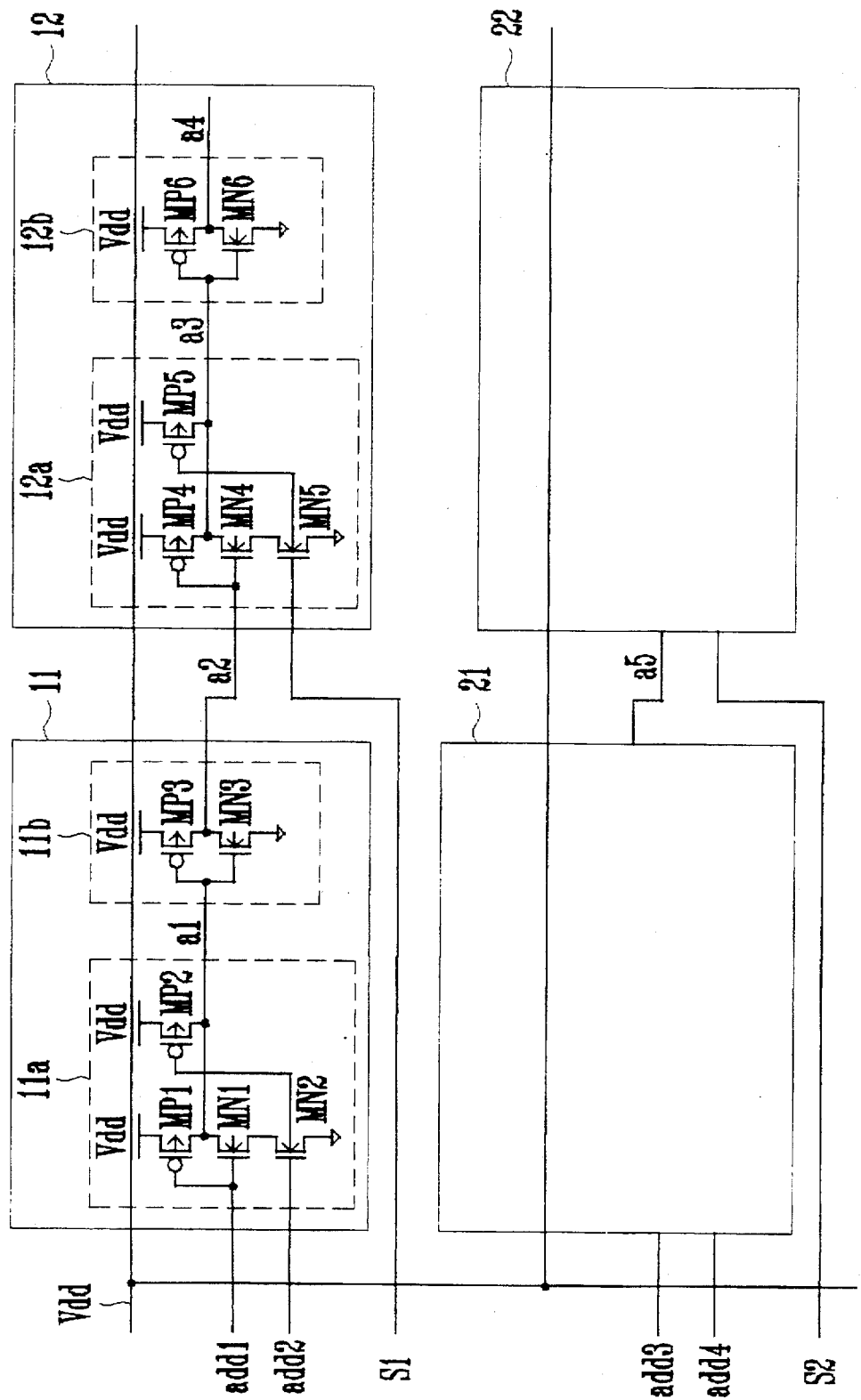
FIG. 2 is a partial circuit diagram of the DRAM for self refresh operation in conventional DRAM.
Figure 4:
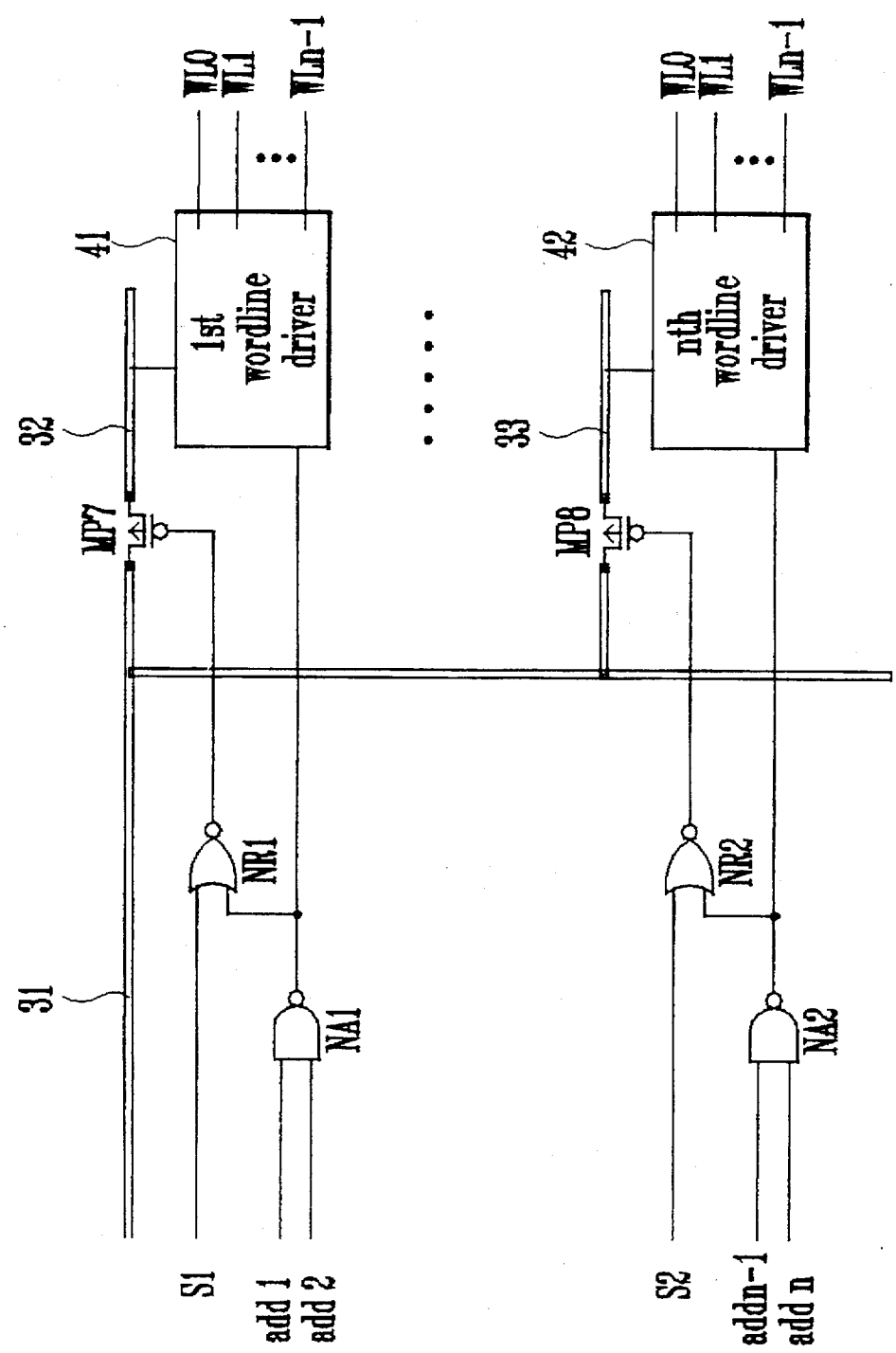
FIG. 4 is a partial circuit diagram of the DRAM for self refresh operation in present invention.

Referring to FIG. 3, the refresh period is T, and N cycles ara required for the refresh of the entire chip, wherein n (=N/m) cycles of refresh are performed in the time interval of T/m with respect to a specific m. The n cycles of refresh performed for T/m period operate in the period of t2. It is noted that time t3 (=t2*n) where the n cycles of refresh are completed is shorter than 0.5*(T/m). FIG. 4 shows the configuration of internal block circuits performing such an operation.

Referring to FIG. 4, the DRAM of the present invention comprises at least two wordline driving circuit portions 41 and 42 for transmitting a high potential Vcc to a wordline selected by an externally input address, a main power line 31 for transmitting an externally supplied power source voltage, secondary power lines 32 and 33 for transmitting power source voltage Vcc to wordline driving circuit portions 41 and 42, respectively, switching devices MP7 and MP8 respectively connected between main power line 31 and secondary power lines 32 and 33, NAND gates NA1 and NA2 for outputting a signal where two block selection addresses are logically combined, to wordline driving circuit portions 41 and 42, and NOR gates NR1 and NR2 for outputting a signal for controlling the switching devices MP7 and MP8, the signal being logically combined with refresh operation mode signals S1 and S2 and the output signals of NAND gates NA1 and NA2. In FIG. 4, wordline driving circuit portions 41 and 42 can be discerned with a block selection address, each of the block circuits having n wordlines.

The self refresh of those circuits is performed in units of blocks at a predetermined interval. Given that the number of blockes is m, n wordlines are refreshed for a part of the time of T/m. The secondary power line 32 applied to wordline driving circuit 41 is coupled to main power line 31 through switching device MP7. A signal for controlling the operation of the switching device is made by logically combining signal S1 indicative of self refresh and address signals add1 and add2 for block selection. Here, the signal controls the switching devices MP7 and MP8 respectively connected to the wordline driving circuits so that the power source voltage is supplied only during the refresh of a block selected.

If signal S1 indicative of self refresh is enabled HIGH, the output signal of NOR gate NO1 becomes LOW, regardless of the output signal of NAND gate NA1, so that the switching device MP7 is always turned ON.

If two block selection address signals add1 and add2 both are HIGH, the output of NAND gate NA1 becomes LOW to operate wordline driving circuit 41. If one of block selection address signals add1 and add2 becomes LOW, the output of NAND gate NA1 becomes HIGH to control the operation of wordline driving circuit 41.

When signal S1 indicative of the self refresh status is HIGH and block selection address signals add1 and add2 both are HIGH, switching device MP7 is kept ON. The power source voltage transmitted to secondary power line 32 from main power line 31 is applied to wordline driving circuit 41 and wordline driving circuit 41 selected by block selection addresses add1 and add2 runs.

If signal S1 indicative of self refresh status is HIGH and block selection address signals add1 and add2 are both not HIGH, switching device MP7 is turned OFF, and the power source voltage is interrupted to wordline driving circuit 41. In this case, the leakage current caused in wordline driving circuit 41 is greatly reduced by interrupting the supply of the power source voltage.

This embodiment can be implemented by another one using a column driving circuit for driving a selected column, instead of wordline driving circuit 41 for driving wordlines in FIG. 4.

As described above, with the DRAM of the present invention, power is applied only to a block which performs refresh, not to the rest blocks which do not perform refresh, reducing the leakage current consumed in the waiting mode.

It will be apparent to those skilled in the art that various modifications and variations can be made in the input buffer for a semiconductor memory device of the present invention without departing from the spirit or scope of the invention. Thus, it is intended that the present invention cover the modifications and variations of this invention provided that they come within the scope of the appended claims and their equivalents.

What is claimed is:

1. A DRAM comprising:

at least two line driving means for transmitting high potential to lines selected by address signals;

a main power line for transmitting a power source voltage externally supplied;

secondary power lines for transmitting the power source voltage to the respective line driving means;

switching means respectively connected between the main power line and secondary power lines;

logic means for outputting a signal which is logically combined by a pair addresses to each of the line driving means, in order to select and operate one of the line driving means; and switching control means for outputting a signal which controls each of the switching means by means of the logical combination of the output signal of the logic means and a refresh operation mode signal.

2. The DRAM as claimed in claim 1, wherein each of the line driving means supplies the power source voltage to a selected wordline.

3. The DRAM as claimed in claim 1, wherein each of the line driving means supplies the power source voltage to a selected column.

4. The DRAM as claimed in claim 1, wherein the switching control means is composed of a MOS transistor.

5. The DRAM as claimed in claim 4, wherein the MOS transistor is a PMOS transistor.

6. The DRAM as claimed in claim 1, wherein the logic means is composed of NAND gates.

7. The DRAM as claimed in claim 1, wherein each of the switching control means is composed of a NOR gate.

* * * * *